(12) United States Patent  
Cho et al.

(10) Patent No.: US 8,063,961 B2
(45) Date of Patent: Nov. 22, 2011

(54) DUAL CDS/PXGA CIRCUIT FOR ADJUSTING GAIN OF AN AMPLIFIER BASED ON CAPACITANCE

(75) Inventors: Young Kyun Cho, Daejeon (KR); Young Deuk Jeon, Daejeon (KR); Chong Ki Kwon, Daejeon (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 619 days.

(21) Appl. No.: 12/195,194

(22) Filed: Aug. 20, 2008

(65) Prior Publication Data

US 2009/0086072 A1     Apr. 2, 2009

(30) Foreign Application Priority Data

Oct. 2, 2007   (KR) .................. 10-2007-0099082

(51) Int. Cl.
*H04N 3/14*     (2006.01)
*H04N 5/335*    (2011.01)
*G11C 27/02*    (2006.01)
*H03K 5/00*     (2006.01)
*H03K 17/00*    (2006.01)

(52) U.S. Cl. ............... 348/301; 348/300; 327/94
(58) Field of Classification Search .............. 348/301
See application file for complete search history.

(56) References Cited

U.S. PATENT DOCUMENTS

| | | | |
|---|---|---|---|
| 5,736,886 A | | 4/1998 | Mangelsdorf et al. |
| 5,757,230 A | * | 5/1998 | Mangelsdorf ................. 330/133 |
| 6,040,570 A | * | 3/2000 | Levine et al. ............... 250/208.1 |
| 6,342,919 B2 | * | 1/2002 | Opris ......................... 348/241 |
| 6,433,632 B1 | * | 8/2002 | Nakamura et al. ................ 330/9 |
| 6,529,237 B1 | | 3/2003 | Tsay et al. |
| 6,587,143 B1 | * | 7/2003 | Boisvert ....................... 348/241 |
| 7,123,301 B1 | | 10/2006 | Nakamura et al. |
| 2005/0195645 A1 | * | 9/2005 | Panicacci et al. ............ 365/156 |

FOREIGN PATENT DOCUMENTS

| | | |
|---|---|---|
| JP | 2001-028716 A | 1/2001 |
| JP | 2006-303604 A | 11/2006 |
| KR | 1020050012558 A | 2/2005 |

OTHER PUBLICATIONS

David Reynolds et al., "An Integrated 12 Bit Analog Front End for CCD Based Image Processing Applications", 1996 Symposium on VLSI Circuits Digest of Technical Papers, pp. 96-97.
Seung-Bin You et al., "A CMOS 16-bit 20MSPS Analog Front End for Scanner/MFP Applications", Manuscript received Jun. 14, 2003, 2003 IEEE, pp. 647-652.
Chris Mangelsdorf et al.,"A CMOS Front-End for CCD Cameras", ISSCC96/ Session 11/ Electronic Imaging Circuits/ Paper FA 11.5, 1996 IEEE International Solid-State Circuits Conference, Digest of Technical Papers.

* cited by examiner

*Primary Examiner* — Lin Ye
*Assistant Examiner* — Chia-Wei A Chen

(57) ABSTRACT

Provided is a dual sampling/pixel gain amplifier (CDS/PxGA) circuit with a shared amplifier, and more particularly, to a dual CDS/PxGA circuit for adjusting a gain of an amplifier based on capacitance. The dual CDS/PxGA circuit comprises: a first sampler for sampling a reset level and a data level of a first pixel; a second sampler for sampling a reset level and a data level of a second pixel; and an operational amplifier for receiving sampling values from the first and second samplers, calculating output signals of the first and second pixels using the sampling values, and amplifying the calculated output signals. Thus, it is possible to reduce a speed of an operational amplifier by using the dual CDS/PxGA structure, reduce power consumption by sharing the operational amplifier, and obtain a variable gain of a wide range by adjusting capacitance using a capacitor array.

17 Claims, 8 Drawing Sheets

DUAL CDS/PXGA CIRCUIT FOR ADJUSTING GAIN OF AN AMPLIFIER BASED ON CAPACITANCE

CROSS-REFERENCE TO RELATED APPLICATION

This application claims priority to and the benefit of Korean Patent Application No. 2007-99082, filed Oct. 2, 2007, the disclosure of which is incorporated herein by reference in its entirety.

BACKGROUND

1. Field of the Invention

The present invention relates to a dual sampling/pixel gain amplifier (CDS/PxGA) circuit with a shared amplifier, and more particularly, to a dual CDS/PxGA circuit for adjusting a gain of an amplifier based on capacitance.

This work was supported by the IT R&D program of MIC/IITA. [2006-S-006-02, Components/Module technology for Ubiquitous Terminals].

2. Discussion of Related Art

A charge coupled device (CCD) is a device for converting an image into an electrical signal, and has been widely used in an apparatus such as camcorders, digital cameras, etc., which store images in a digital data form. In converting the image into the electrical signal, the CCD receives data levels and reset levels from a plurality of pixels to output them in a form of a single-ended signal. In order to minimize influence of reset noise generated between the respective pixels in such a process, a correlated double sampling (CDS) circuit subtracts the data level from the reset level to generate output signals for the respective pixels.

FIG. 1a illustrates an image processing process using a conventional CDS circuit. Referring to FIG. 1a, an output signal of each CCD pixel can be classified into one of a red signal R, a green signal G, or a blue signal B based on a color filter of the pixel, wherein the respective color signals can have different magnitudes.

If output signals of the CDS circuit are amplified by a variable gain amplifier (VGA), the respective color signals obtain the same amount of noise. Therefore, the respective color signals having the different magnitudes have different signal to noise ratios (SNRs). That is, since a signal amplification range of the VGA is limited by means of the largest signal (G), a relatively small signal (B) is not sufficiently amplified, and thus the SNR thereof becomes small.

Thereafter, amplified signals are converted into digital signals through an analog to digital converter (ADC), and a digital signal processor (DSP), as a final stage, adjusts the respective color signals containing the noise to the same magnitude. Since the DSP can not reduce the magnitude of the noise generated in an analog stage, the blue signal B contains more noise than the green signal G or the red signal R, among the signals passing through the DSP.

In order to solve such a problem, it is necessary to adjust the CDS output signals having the different magnitudes to the same magnitude before they are provided to the VGA stage. Referring to FIG. 1b, a pixel gain amplifier (PxGA) amplifies the CDS output signals with different gains to adjust the CDS output signals having the different magnitudes to the same magnitude. Thus, it is possible to improve the SNR of the output signal processed by the DSP in the image processing process, by adding the PxGA after the CDS.

Such a PxGA can be implemented using a programmable amplifier having a gain adjustable according to pixel output. Accordingly, a CDS/PxGA circuit capable of simultaneously performing both functions of the CDS and the PxGA using a capacitance-based programmable amplifier has been proposed.

FIG. 2a is a circuit diagram of a conventional CDS/PxGA circuit, and FIG. 2b is a timing diagram of the conventional CDS/PxGA circuit.

Referring to FIGS. 2a and 2b, when a clock q1 becomes high, a switch for connecting an output terminal of an operational amplifier (OP AMP) to a negative input terminal thereof is closed, a sampling capacitor ($C_s$) 202 samples a reset level $V_{reset}$ applied to an input unit 201, and a feedback capacitor ($C_{fb}$) 203 samples reference voltage. In an exemplary embodiment, the reference voltage can be ground voltage.

Next, when a clock q2 becomes high, the sampling capacitor 202 samples a data level $V_{data}$ applied to the input unit 201, and the feedback capacitor 203 is connected to the output terminal of the OP AMP 204. Accordingly, charges move from the sampling capacitor 202 to the feedback capacitor 203 so that an output signal of an output unit 205 has a value of $(C_s/C_{fb})/(V_{reset}-V_{data})$. Therefore, the conventional CDS/PxGA circuit can adjust gains for the respective pixel outputs using capacitance values of the sampling capacitor and the feedback capacitor.

However, since the conventional CDS/PxGA circuit uses only one input, it must receive both of reset signals and data signals via one sampling capacitor. Therefore, output valid time OUTPUT VALID becomes a half of a period T of the clocks q1 and q2. This requires an operational amplifier having a twice higher speed than the period T of the clocks q1 and q2 and increases power consumption.

In addition, the conventional CDS/PxGA circuit cannot implement a gain less than 0 dB, and therefore it can amplify a small signal to a large signal but cannot attenuate the large signal to the small signal, and cannot reflect offset of the CCD output signal in the output signal of the CDS/PxGA circuit.

SUMMARY OF THE INVENTION

The present invention is directed to a CDS/PxGA circuit capable of being implemented using a slower operational amplifier, performing both amplification and attenuating, and correcting an output signal according to offset of a CCD output signal.

One aspect of the present invention provides a dual CDS/PxGA circuit comprising: a first sampler for sampling a reset level and a data level of a first pixel; a second sampler for sampling a reset level and a data level of a second pixel; and an operational amplifier for receiving sampling values from the first and second samplers, calculating output signals of the first and second pixels using the sampling values, and amplifying the calculated output signals, wherein a gain of the operational amplifier is determined based on capacitance of capacitors included in the first and second samplers.

BRIEF DESCRIPTION OF THE DRAWINGS

The above and other features and advantages of the present invention will become more apparent to those of ordinary skill in the art by describing in detail a preferred embodiment thereof with reference to the attached drawings in which.

DETAILED DESCRIPTION OF PREFERRED EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art.

Figure 1A:
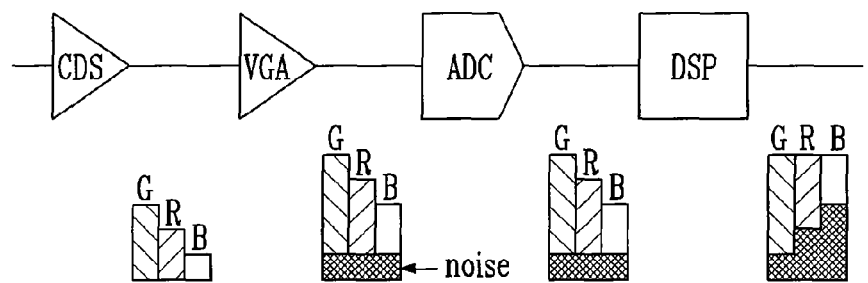
FIG. 1a illustrates an image processing process using a conventional CDS circuit.
Figure 1B:
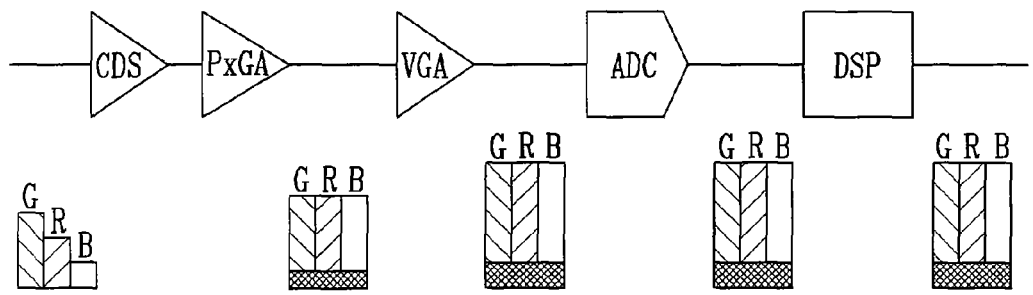
FIG. 1b illustrates an image processing process using a conventional CDS/PxGA circuit.
Figure 2A:
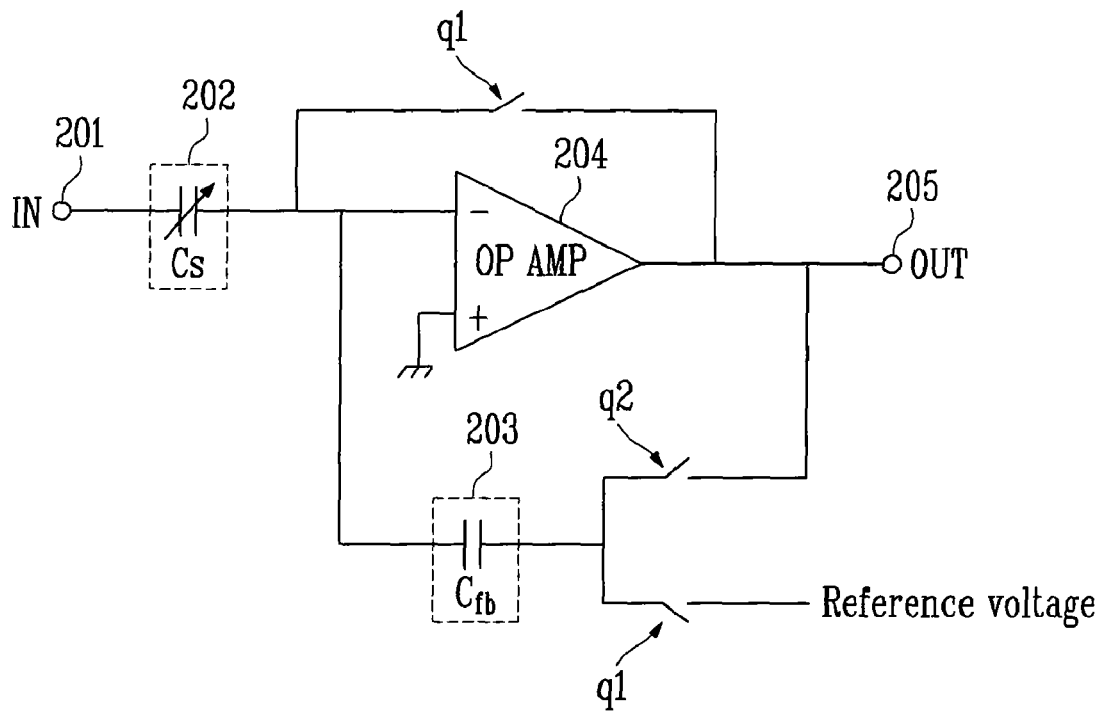
FIG. 2a is a circuit diagram illustrating a conventional CDS/PxGA circuit.
Figure 2B:
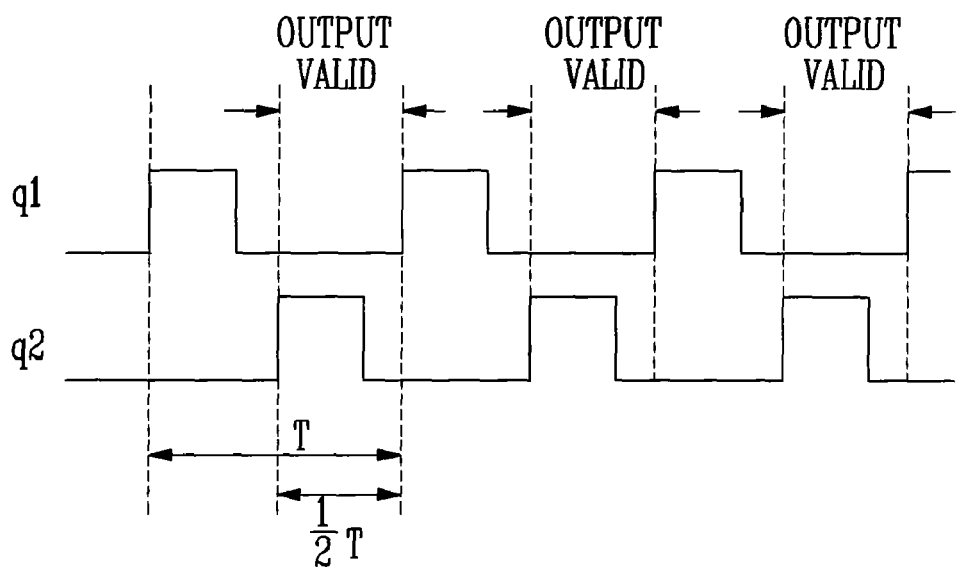
FIG. 2b is a timing diagram illustrating clocks for a conventional CDS/PxGA circuit.
Figure 3A:
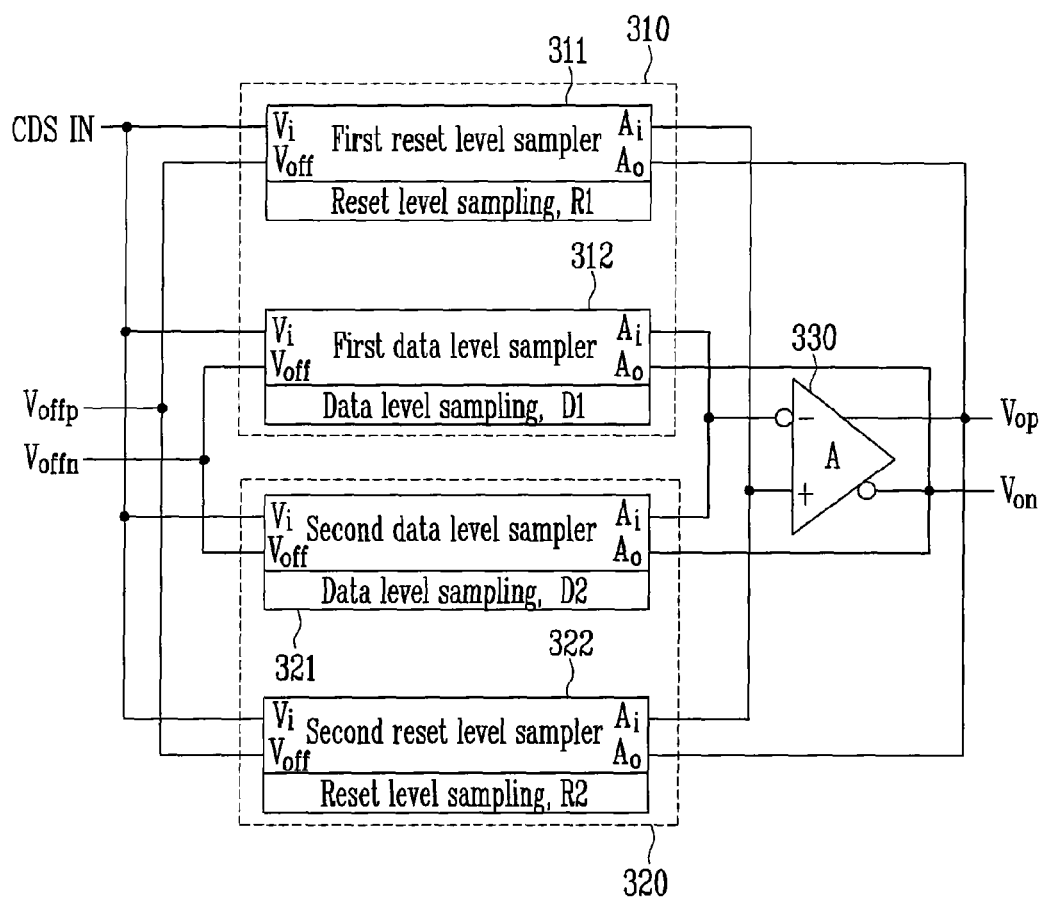
FIG. 3a is a block diagram illustrating a CDS/PxGA circuit according to an exemplary embodiment of the present invention.
Figure 3B:
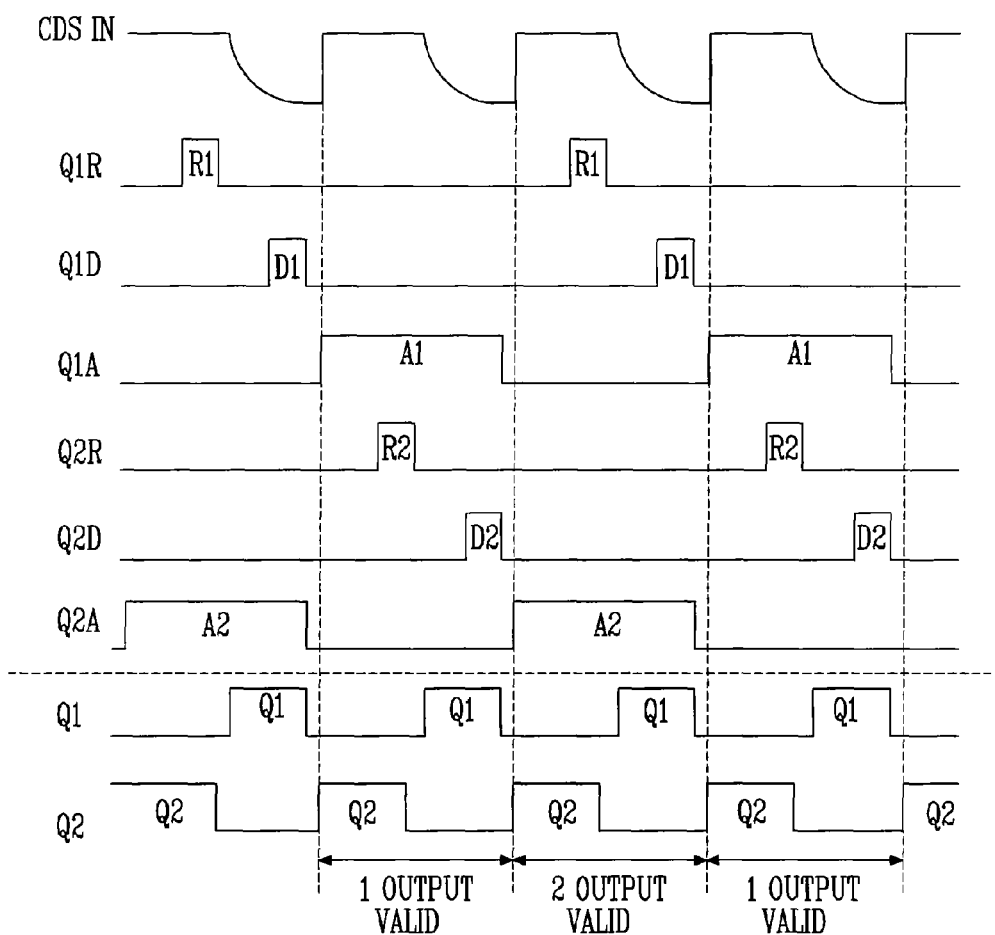
FIG. 3b is a timing diagram illustrating operation clocks for the CDS/PxGA circuit according to an exemplary embodiment of the present invention.

FIG. 3a is a block diagram illustrating a CDS/PxGA circuit according to an exemplary embodiment of the present invention, and FIG. 3b is a timing diagram illustrating operation clocks for the CDS/PxGA circuit according to an exemplary embodiment of the present invention.

Referring to FIG. 3a, the CDS/PxGA circuit comprises two samplers 310 and 320, and an operational amplifier 330. A CCD output signal comprising a reset level and a data level for each pixel is input as a CDS input signal CDS IN. The samplers 310 and 320, and the operational amplifier 330 generate and amplify output signals for each pixel using the CDS input signal CDS IN to output them to output terminals $V_{op}$ and $V_{on}$. Offset voltage terminals $V_{offp}$ and $V_{offn}$, which are inputs for compensating offset of the CCD output signal, will be described below with reference to FIG. 7.

The first sampler 310 comprises a first reset level sampler 311 and a first data level sampler 312 for sampling a reset level and a data level of a first pixel from the CDS input signal CDS IN, respectively. Also, the second sampler 320 comprises a second reset level sampler 322 and a second data level sampler 321 for sampling a reset level and a data level of a second pixel from the CDS input signal CDS IN, respectively.

Referring to FIG. 3b, the CDS input signal CDS IN represents reset and data levels of each pixel alternated in a certain period. Although the reset level and the data level may be different for each pixel, FIG. 3b shows that each pixel has output of the same reset level and data level, for ease of understanding.

The first reset level sampler 311 and the first data level sampler 312 sample the reset level and the data level of the first pixel from the CDS input signal CDS IN in a period R1 in which a clock Q1R is high, and a period D1 in which a clock Q1D is high, respectively. At the same time, the difference between the reset level and the data level of the second pixel sampled in a previous period is amplified in a period A2 in which a clock Q2A is high.

When the sampling and the amplification are completed, the second reset level sampler 322 and the second data level sampler 321 sample the reset level and the data level of the second pixel from the CDS input signal CDS IN in a period R2 in which a clock Q2R is high, and a period D2 in which a clock Q2D is high, respectively. Simultaneously, the difference between the reset level and the data level of the first pixel sampled in the R1 and D1 is amplified in a period A1 in which a clock Q1A is high.

It can be seen that output valid time OUTPUT VALID is the same as the period of the clocks Q1 and Q2, as opposed to the conventional CDS/PXGA circuit having no shared amplifier. In other words, the operational amplifier 330 can operate at half a speed of the operational amplifier in the conventional CDS/PXGA circuit. Accordingly, power consumption of the CDS/PXGA circuit can be reduced. Also, the shared operational amplifier can reduce a chip area.

Figure 4:
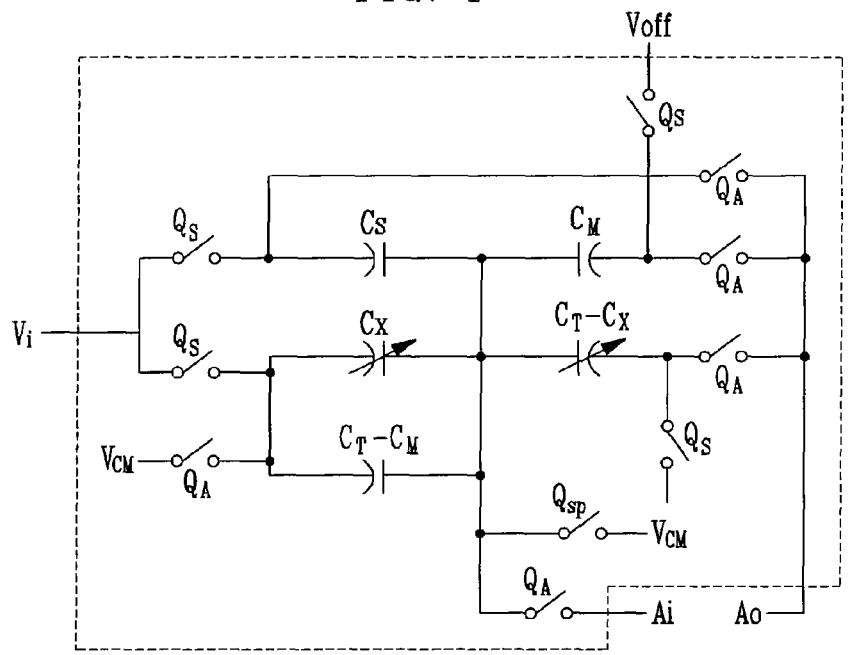
FIG. 4 illustrates a configuration of the reset level sampler and data level sampler included in the CDS/PxGA circuit according to an exemplary embodiment of the present invention.

FIG. 4 illustrates a configuration of the respective reset level sampler and data level sampler included in the CDS/PxGA circuit according to an exemplary embodiment of the present invention.

Referring to FIG. 4, the reset level sampler and data level sampler receive the CDS input signal through an input terminal $V_i$, and are connected to an input terminal and an output terminal of the operational amplifier through an amplifier input terminal $A_i$ and an amplifier output terminal $A_o$. An offset voltage terminal $V_{off}$, which is an input for compensating the offset of the CCD output signal, will be described below with reference to FIG. 7. A common mode voltage terminal $V_{CM}$ is a terminal for receiving a common mode voltage, which serves as a reference voltage at one side of capacitors in sampling and amplification periods.

Switches $Q_S$ are sampling switches that are closed in sampling periods, such as periods R1, D1, R2, and D2 in which the clock Q1R, Q1D, Q2R, or Q2D is high so that the reset level or the data level is sampled. A switch $Q_A$ is an amplification switch that is closed in amplification periods, such as periods A1 and A2 in which the clock Q1A or Q2A is high so that the difference between the sampled reset level and data level is amplified. For example, the switches $Q_S$ and $Q_A$ in the first reset level sampler 311 are closed in the periods R1 and A1, respectively, and the switches $Q_S$ and $Q_A$ in the first data level sampler 312 are closed in the periods D1 and A1, respectively. A switch $Q_{SP}$ is a prime clock switch of the switch $Q_S$ which is closed like the switch $Q_S$ but opened just before the switch $Q_S$ is opened. The switch $Q_{SP}$ is used to minimize a clock feed-through phenomenon generated in a switched capacitor circuit.

The respective reset level sampler and data level sampler comprise a first sampling capacitor $C_S$, a second sampling capacitor $C_T$-$C_M$, a first variable capacitor $C_X$, a second variable capacitor $C_T$-$C_X$, and a correction capacitor $C_M$. The respective capacitors can operate as sampling capacitors and/or feedback capacitors in the sampling period and the amplification period. Also, the correction capacitor $C_M$ is used for compensating the offset of the output signal, which will be described below in detail with reference to FIG. 7.

Figure 5:
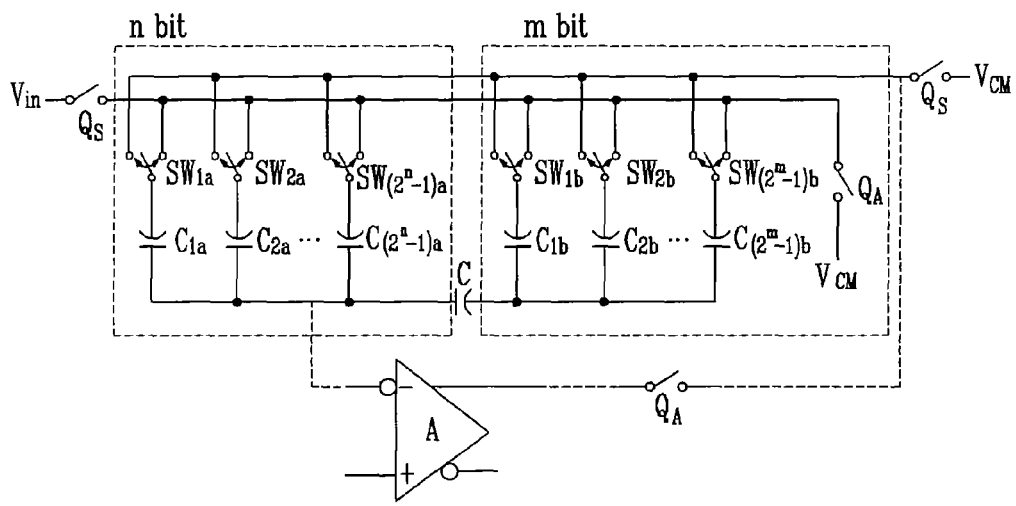
FIG. 5 illustrates a configuration of a unit capacitor array included in the CDS/PxGA circuit according to an exemplary embodiment of the present invention.

In an exemplary embodiment, the first variable capacitor $C_X$ and the second variable capacitor $C_T$-$C_X$ can be implemented as unit capacitor array. Referring to FIG. 5, the unit capacitor array includes $2^n+2^m-1$ capacitors to obtain a variable gain of n+m bits. In this case, capacitances of all the capacitors included in the unit capacitor array are C.

$$C_{1a}=C_{2d}=\ldots=C_{(2^n-1)a}=C_{1b}=C_{2b}=\ldots=C_{(2^m-1)b}=C$$

In order to adjust the capacitances of the first variable capacitor $C_X$ and the second variable capacitor $C_T$-$C_X$, P switches of switches $SW_{1a}$ to $SW_{(2^n-1)a}$ included in a capacitor array of n bits and q switches of switches $SW_{1b}$ to $SW_{(2^m-1)b}$ included in a capacitor array of m bits are connected to input voltage $V_{in}$ in the sampling period. In this case, the capacitors connected to the input voltage $V_{in}$ by means of p+q switches constitute the first variable capacitor $C_x$ of which the capacitance is calculated by Equation 1:

$$C_x = \left(p + \frac{q}{2^m}\right) \cdot C \qquad \text{[Equation 1]}$$

Meanwhile, remaining $2^n-p-1$ switches of the switches included in the capacitor array of the n bits and remaining $2^m-q-1$ switches of the switches included in the capacitor array of the m bits are connected to a common mode voltage terminal $V_{CM}$ in the same sampling period. In this case, the capacitors connected to the common mode voltage terminal $V_{CM}$ by means of $2^n-p+2^m-q-2$ switches constitutes the second variable capacitor $C_T$-$C_X$ of which the capacitance is calculated by Equation 2. Here, $C_T$ indicates the capacitance of the capacitor constituted by the unit capacitor array when all the switches included in the unit capacitor array are connected to the same terminal.

$$C_T - C_x = \left(2^n - p - 1 + \frac{2^m - q - 1}{2^m}\right) \cdot C \qquad \text{[Equation 2]}$$

Next, the first variable capacitor $C_X$ is connected to the common mode voltage terminal $V_{CM}$ and the second variable capacitor $C_T$-$C_X$ are connected to the output terminal of the operational amplifier, in the amplification period. Therefore, the first variable capacitor $C_X$ and the second variable capacitor $C_T$-$C_X$ implemented as the unit capacitor array can operate like the first variable capacitor $C_X$ and the second variable capacitor $C_T$-$C_X$ shown in FIG. 4 in the sampling period and the amplification period.

In another exemplary embodiment, the variable capacitors $C_X$ and $C_T$-$C_X$ may be implemented as a binary weight capacitor array.

All of the reset level samplers and the data level samplers can be equally constituted as the above-mentioned structure in consideration of sampling signal magnitude, mismatch between the capacitors, etc.

Figure 6A:
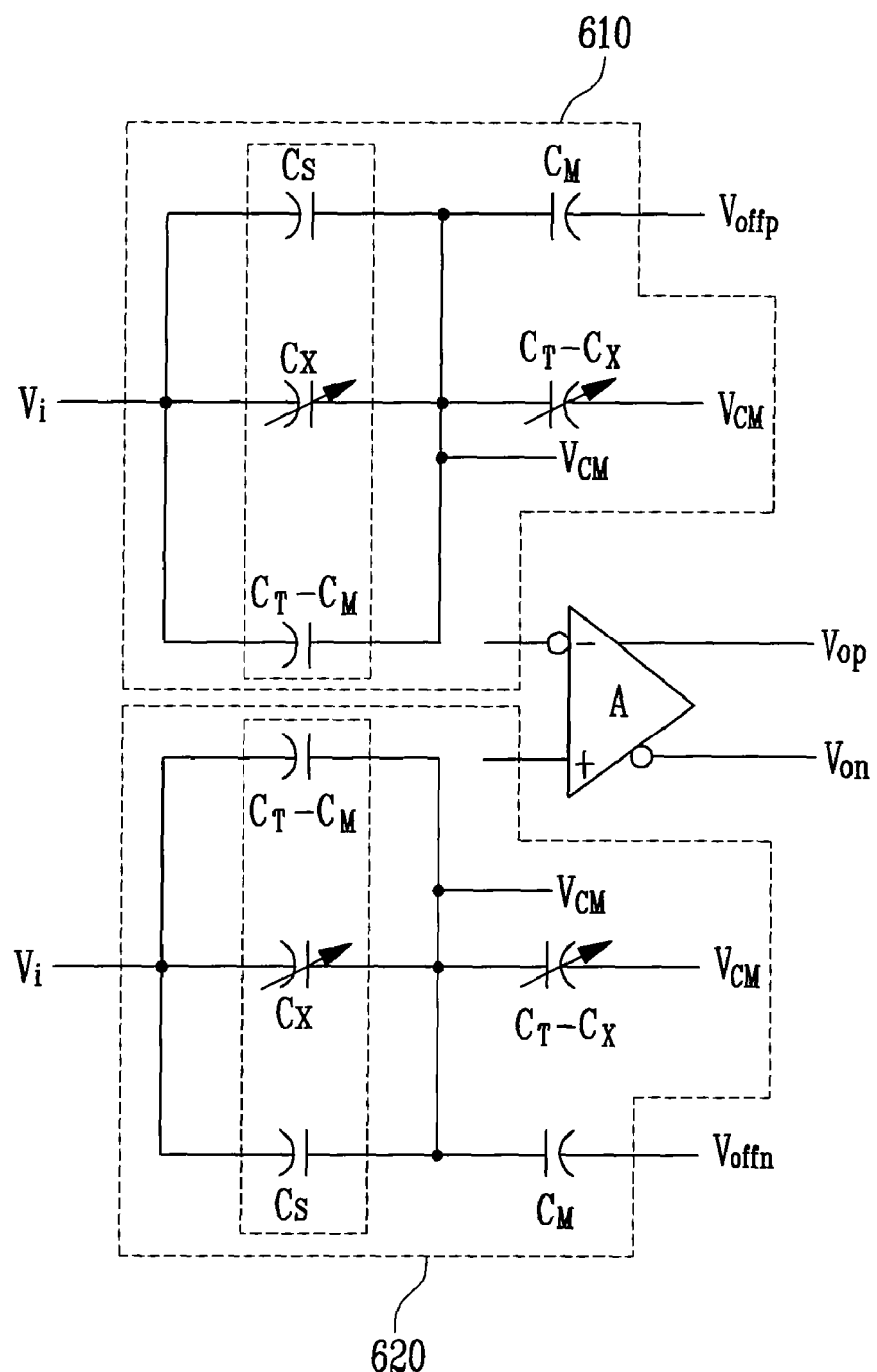
FIG. 6a illustrates a circuit state of a first sampler included in the CDS/PxGA circuit according to an exemplary embodiment of the present invention in a sampling period.
Figure 6B:
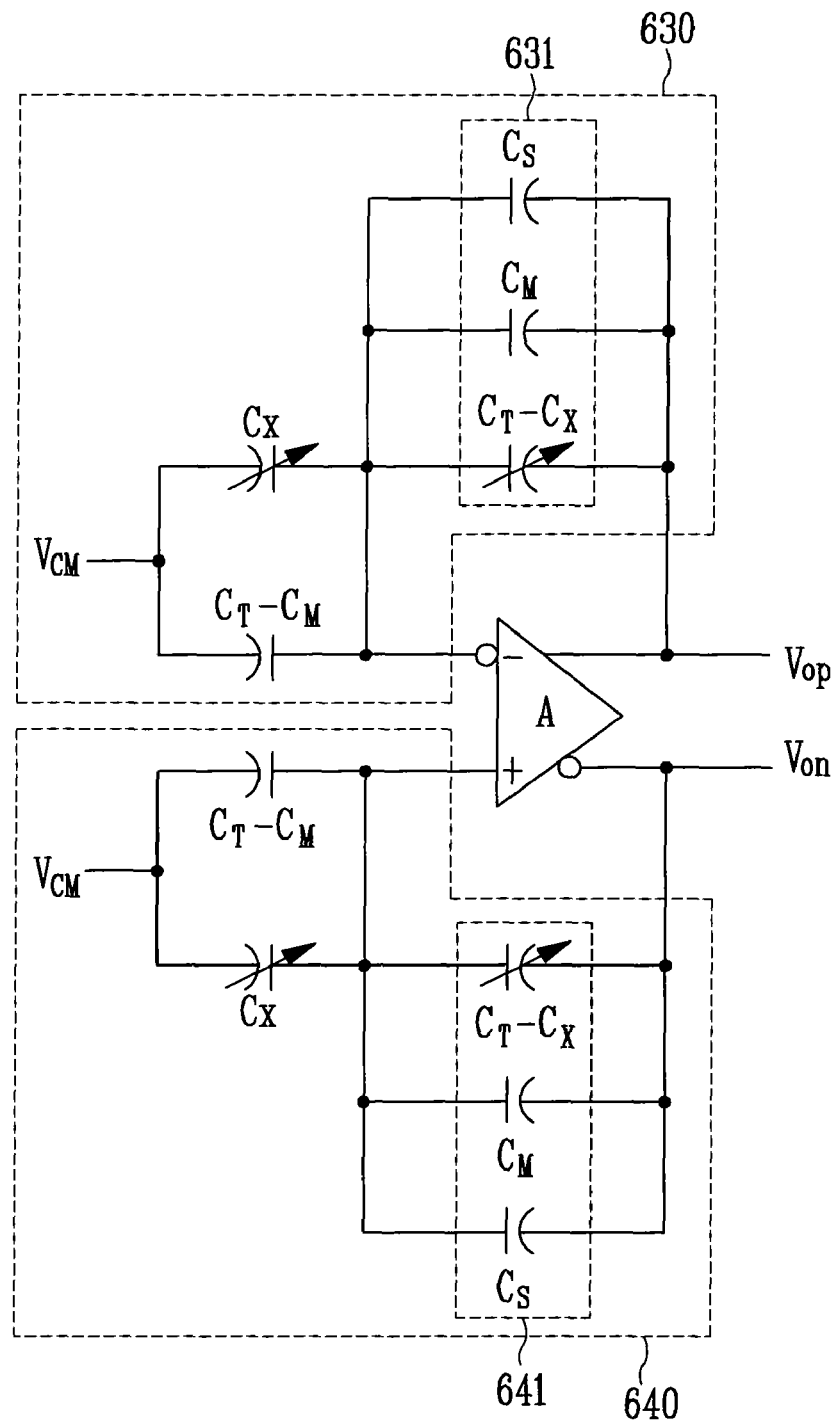
FIG. 6b illustrates a circuit state of the first sampler included in the CDS/PxGA circuit according to an exemplary embodiment of the present invention in an amplification period.

FIG. 6a illustrates a circuit state of a first sampler included in the CDS/PxGA circuit according to an exemplary embodiment of the present invention in the sampling period, and FIG. 6b illustrates a circuit state of the first sampler included in the CDS/PxGA circuit according to an exemplary embodiment of the present invention in the amplification period.

Referring to FIG. 6a, the first sampling capacitor $C_S$, the first variable capacitor $C_X$, and the second sampling capacitor $C_T$-$C_M$ simultaneously operate as sampling capacitors in the sampling period. Therefore, the total sampling capacitance $C_{st}$ is calculated by Equation 3 below.

$$C_{st}=C_s+C_T+(C_x-C_M) \qquad \text{[Equation 3]}$$

Referring to FIG. 6b, the first sampling capacitor $C_S$, the correction capacitor $C_M$, and the second variable capacitor $C_T$-$C_X$ simultaneously operate as feedback capacitors in the amplification period. Therefore, the total feedback capacitance $C_{ft}$ is calculated by Equation 4 below.

$$C_{ft}=C_s+C_T-(C_x-C_M) \qquad \text{[Equation 4]}$$

Referring to Equations 3 and 4, a gain Av of the PXGA included in the CDS/PxGA circuit according to an exemplary embodiment of the present invention is calculated by Equation 5 below.

$$A_v = \frac{C_{st}}{C_{ft}} = \frac{C_s + C_T + (C_X - C_M)}{C_s + C_T - (C_X - C_M)} \qquad \text{[Equation 5]}$$

Equation 5 can be converted into $(1+x)/(1-x) \approx e^{2X}$ according to first approximation of an exponential function. Here, $x=(C_x-C_M)/(C_s+C_T)$. Therefore, the gain Av of the PxGA can be limited to between −15 dB and 15 dB in order to satisfy linearity in dB.

Referring to FIGS. 6a and 6b, the first sampling capacitor $C_s$ is commonly used in the sampling section and the amplification section. Sharing the first sampling capacitor Cs in the sampling period and the amplification period allows it to reduce a parasitic capacitance and the mismatch between capacitances, thereby making it possible to minimize a voltage gain error.

Referring to Equation 5, as the value of $C_M$ increases, a denominator increases and a numerator decreases and thus, the gain Av of the PxGA gradually converges to zero. Therefore, it is possible to implement a gain of less than 0 dB, that is, a gain of 0 to 1 according to capacitance of the correction capacitor $C_M$. Accordingly, the PxGA can attenuate the large signal to the small signal in reducing the difference between the CDS output signals for the respective CCD pixels, thereby making it possible to more efficiently adjust magnitude of the CDS output signal.

Figure 7:
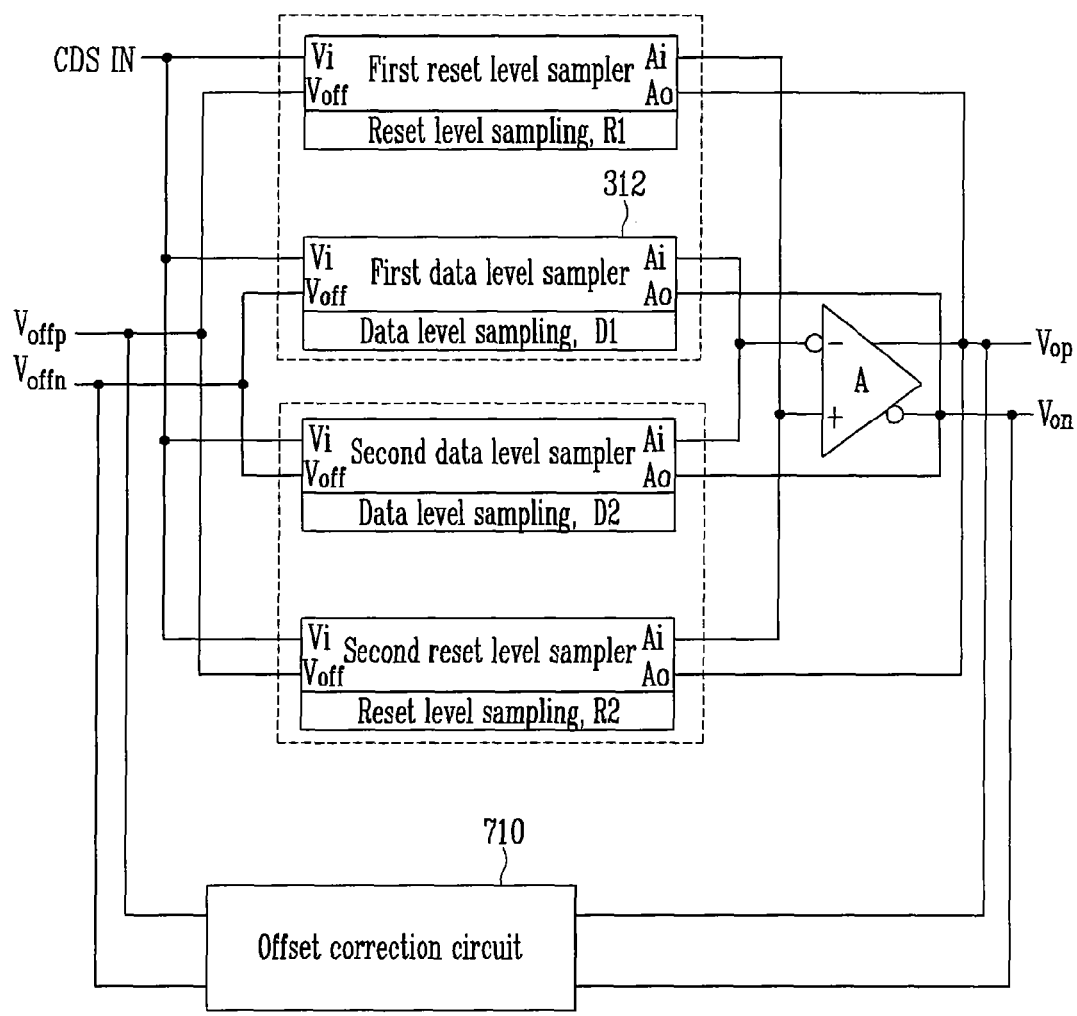
FIG. 7 is a block diagram illustrating the CDS/PxGA circuit including an offset correction circuit according to an exemplary embodiment of the present invention.

FIG. 7 is a block diagram illustrating the CDS/PxGA circuit including an offset correction circuit according to an exemplary embodiment of the present invention.

Referring to FIG. 7, the CDS/PxGA circuit can use the offset correction circuit 710 to compensate offset of the CCD output signal. The offset correction circuit 710 can detect an output of the CDS/PxGA circuit to generate correction signals, and apply the generated correction signals to offset voltage terminals $V_{off}$ of the respective samplers.

In an exemplary embodiment, the offset correction circuit 710 may be constituted by an integrator circuit. In a black level offset correction period, the integrator of the offset correction circuit 710 integrates the output of the CDS/PxGA circuit, and the CDS/PxGA circuit feeds the difference between the output of the integrator and a sampled black level signal back to the integrator. With such a negative feedback operation, the offset correction circuit 710 can generate the correction signal for compensating the offset of the CCD output signal.

A process in which the correction signal applied through the offset voltage terminal $V_{off}$ of the sampler is reflected in the output of the CDS/PxGA circuit will be described with reference to FIG. 6a. Referring to FIG. 6a, the correction signals applied to the offset voltage terminals $V_{offp}$ and $V_{offn}$ are applied to the correction capacitor $C_M$ in the sampling period. Accordingly, the correction capacitor $C_M$ operates like a sampling capacitor for the offset voltage in the amplification period, and the output of the CDS/PxGA circuit in which the correction signal is reflected is calculated by Equation 6 below.

$$V_{out} = \frac{C_s + C_T + (C_x - C_M)}{C_s + C_T - (C_x - C_M)} \cdot V_{in} + \frac{C_M}{C_s + C_T - (C_x - C_M)} \cdot V_{off} \quad \text{[Equation 6]}$$

As another method for compensating the offset, the CDS/PxGA circuit can directly apply an optional offset voltage to the offset voltage terminal $V_{off}$ or the common mode voltage terminal $V_{CM}$. By applying the optional offset voltage, an offset value not compensated by the offset correction circuit or an additional offset value requested by a user can be applied to the CDS/PxGA circuit.

Also, the application of the optional offset voltage can lead to a change in a voltage level of the CCD output signal. For example, in image processing using the CCD operating at 3.3V, all circuits after the CCD, comprising a CDS, a VGA, and an ADC should operate at 3.3V. However, in the amplification step, the optional offset voltage can be applied to the respective samplers to adjust the input signal of the amplifier to a voltage of 1.2V or less, so that circuits after the operational amplifier can be constituted by transistors operating at 1.2V.

The present invention can reduce a speed of an operational amplifier by using the dual CDS/PxGA structure, reduce power consumption by sharing the operational amplifier, and obtain a variable gain of a wide range by adjusting the capacitance using a capacitor array.

Also, the present invention can implement a negative gain using additional capacitors in the respective samplers.

In addition, the present invention can compensate offset of the CCD output signal in the output using an offset correction circuit, and adjust operation voltage of the circuit by applying an optional offset to the output signal.

It is apparent to those skilled in the art that the invention is not limited to the above-mentioned embodiment and accompanying drawings, but various substitutions, modifications, and changes may be made therein without departing from the spirit and scope of the invention.

What is claimed is:

1. A dual CDS/PxGA circuit comprising:
   a first sampler configured to sample a reset level and a data level of a first pixel;
   a second sampler configured to sample a reset level and a data level of a second pixel; and
   an operational amplifier configured to receive sampling values from the first and second samplers, calculate output signals of the first and second pixels using the sampling values, and amplify the calculated output signals,
   wherein a gain of the operational amplifier is determined based on capacitance of capacitors included in the first and second samplers,
   wherein the first sampler comprises:
      a first reset level sampler configured to sample the reset level of the first pixel; and
      a first data level sampler configured to sample the data level of the first pixel,
   wherein the second sampler comprises:
      a second reset level sampler configured to sample the reset level of the second pixel; and
      a second data level sampler for sampling the data level of the second pixel, and
   wherein the first reset level sampler, the first data level sampler, the second reset level sampler, and the second data level sampler comprise a plurality of capacitors and have substantially the same structure,
   wherein each of the first reset level sampler, the first data level sampler, the second reset level sampler, and the second data level sampler comprises:
      first and second sampling switches, each of which includes a first end that is coupled to an input terminal;
      a first amplification switch including a first end that is coupled to a common mode voltage terminal;
      a first sampling capacitor including a first end that is coupled to a second end of the first sampling switch;
      a second sampling capacitor including a first end that is coupled to a second end of the second sampling switch and a second end of the first amplification switch;
      a first variable capacitor including a first end that is coupled to the second end of the second sampling switch and the second end of the first amplification switch;
      a second variable capacitor including a first end that is coupled to a common node of second ends of the first sampling capacitor, the first variable capacitor and the second sampling capacitor; and
      a third sampling switch coupled between a second end of the second variable capacitor and the common mode voltage terminal.

2. The dual CDS/PxGA circuit according to claim 1, wherein each of the first reset level sampler, the first data level sampler, the second reset level sampler, and the second data level sampler comprises a plurality of capacitors for determining total sampling capacitance or total feedback capacitance.

3. The dual CDS/PxGA circuit according to claim 2, wherein at least one capacitor of the plurality of capacitors is used for determinations of both the total sampling capacitance and the total feedback capacitance.

4. The dual CDS/PxGA circuit according to claim 2, wherein the plurality of capacitors comprise at least one variable capacitor.

5. The dual CDS/PxGA circuit according to claim 4, wherein the at least one variable capacitor is comprised of a capacitor array comprising a plurality of capacitors and a plurality of switches.

6. The dual CDS/PxGA circuit according to claim 1, wherein the gain of the operational amplifier comprises a range of 0 to 1.

7. The dual CDS/PxGA circuit according to claim 6, wherein the first and second samplers comprise a correction capacitor for adjusting the gain of the operational amplifier to 0 to 1.

8. The dual CDS/PxGA circuit according to claim 6, wherein the gain of the operational amplifier is between −15 dB and +15 dB.

9. The dual CDS/PxGA circuit according to claim 1, further comprising an offset correction circuit configured to generate offset correction signals based on the output of the operational amplifier and transfer the offset correction signals to the first and second samplers.

10. The dual CDS/PxGA circuit according to claim 9, wherein the first and second samplers comprise a correction capacitor for sampling the offset correction signal.

11. The dual CDS/PxGA circuit according to claim 1, wherein the first and second samplers directly receive a predetermined offset value through an offset voltage terminal or a common mode voltage terminal.

12. The dual CDS/PxGA circuit according to claim 1, wherein the plurality of capacitors comprises a plurality of variable capacitors that includes a unit capacitor array to adjust the gain of the operational amplifier, the unit capacitor array including a plurality of unit capacitors.

13. The dual CDS/PxGA circuit according to claim 12, wherein the unit capacitor array comprises $2^n+2^m-1$ numbers of unit capacitors to obtain a variable gain of n+m bits.

14. The dual CDS/PxGA circuit according to claim 1, wherein each of the first reset level sampler, the first data level sampler, the second reset level sampler, and the second data level sampler further comprises:
- a second amplification switch coupled between the second end of the first sampling switch and an output terminal of the operational amplifier;
- a third amplification switch coupled between the common node and the output terminal of the operational amplifier;
- a fourth amplification switch coupled between the second end of the second variable capacitor and the output terminal of the operational amplifier;
- a fifth amplification switch coupled between the common node and an input terminal of the operational amplifier; and
- a prime clock switch coupled between the common node and the common mode voltage terminal.

15. The dual CDS/PxGA circuit according to claim 14, wherein each of the first reset level sampler, the first data level sampler, the second reset level sampler, and the second data level sampler further comprises:
- a correction capacitor coupled between the common node and the first end of the third amplification switch; and
- a fourth sampling switch coupled between an offset voltage terminal and a second end of the correction capacitor.

16. The dual CDS/PxGA circuit according to claim 14, wherein a common mode voltage provided through the common mode voltage terminal serves as a reference voltage in sampling and amplification periods.

17. The dual CDS/PxGA circuit according to claim 14, wherein the sampling switches are closed in sampling periods; the amplification switches are closed in amplification periods; and the prime clock switch is closed like the sampling switches but opened just before the sampling switches are opened to minimize a clock feed-through phenomenon.

* * * * *